United States Patent [19]
Agwani et al.

[11] Patent Number: 5,705,836
[45] Date of Patent: Jan. 6, 1998

[54] EFFICIENT CHARGE TRANSFER STRUCTURE IN LARGE PITCH CHARGE COUPLED DEVICE

[75] Inventors: Suhail Agwani, Kitchener; Stacy Royce Kamasz, Waterloo, both of Canada; Michael George Farrier, Boyne City, Mich.

[73] Assignee: Dalsa, Inc., Canada

[21] Appl. No.: 445,994

[22] Filed: May 22, 1995

[51] Int. Cl.$^6$ .................................................. H01L 24/78
[52] U.S. Cl. ........................... 257/221; 257/219; 257/240
[58] Field of Search ................................. 257/219, 221, 257/404, 463, 655, 222, 245, 246, 247

[56] References Cited

U.S. PATENT DOCUMENTS

| | | | |
|---|---|---|---|
| 3,796,932 | 3/1974 | Amelio et al. | 257/221 |
| 4,168,444 | 9/1979 | van Santen | 257/222 |
| 4,242,692 | 12/1980 | Hagiwara | 357/24 |
| 4,377,794 | 3/1983 | Sakaue et al. | 257/236 |
| 4,583,003 | 4/1986 | Kimata | 257/232 |
| 4,589,005 | 5/1986 | Matsuda et al. | 357/24 |
| 4,688,067 | 8/1987 | Rehak et al. | 357/29 |
| 4,798,958 | 1/1989 | Janesick et al. | 250/370.01 |
| 4,821,081 | 4/1989 | Hynecek | 357/24 |
| 4,907,050 | 3/1990 | Yamada | 357/24 |
| 4,910,569 | 3/1990 | Erhardt | 357/24 |
| 4,965,648 | 10/1990 | Yana et al. | 257/221 |
| 4,992,842 | 2/1991 | Yang et la. | 357/24 |
| 5,286,990 | 2/1994 | Hynecek | 257/247 |
| 5,289,022 | 2/1994 | Iizuka et al. | 257/220 |
| 5,379,067 | 1/1995 | Miura | 357/24 |

*Primary Examiner*—Tom Thomas
*Assistant Examiner*—David B. Hardy
*Attorney, Agent, or Firm*—Banner & Witcoff, Ltd.

[57] ABSTRACT

In a charge coupled device having a plurality of output structures, the plurality of output structures including first and second output structures, a channel structure is defined in a channel region beneath a gate electrode and coupled to each of the plurality of output structures. The channel structure includes a plurality of area structures, each area structure being characterized by a uniform potential which is different from the potential characterizing each of the other area structures. The plurality of area structures are arranged within the channel region to define a first increasing stepped potential gradient from any point within the channel region to the first output structure and define a second increasing stepped potential gradient from any point within the channel region to the second output structure. A length of each area structure traversing the area structure in a first gradient direction is less than or equal to a first critical length, the first critical length being defined by a first desired transfer time for transferring charge to the first output structure. A length of each area structure traversing the area structure in a second gradient direction is less than or equal to a second critical length, the second critical length being defined by a second desired transfer time for transferring charge to the second output structure.

9 Claims, 11 Drawing Sheets

POTENTIAL
↓
+V
↓
POSITIVE

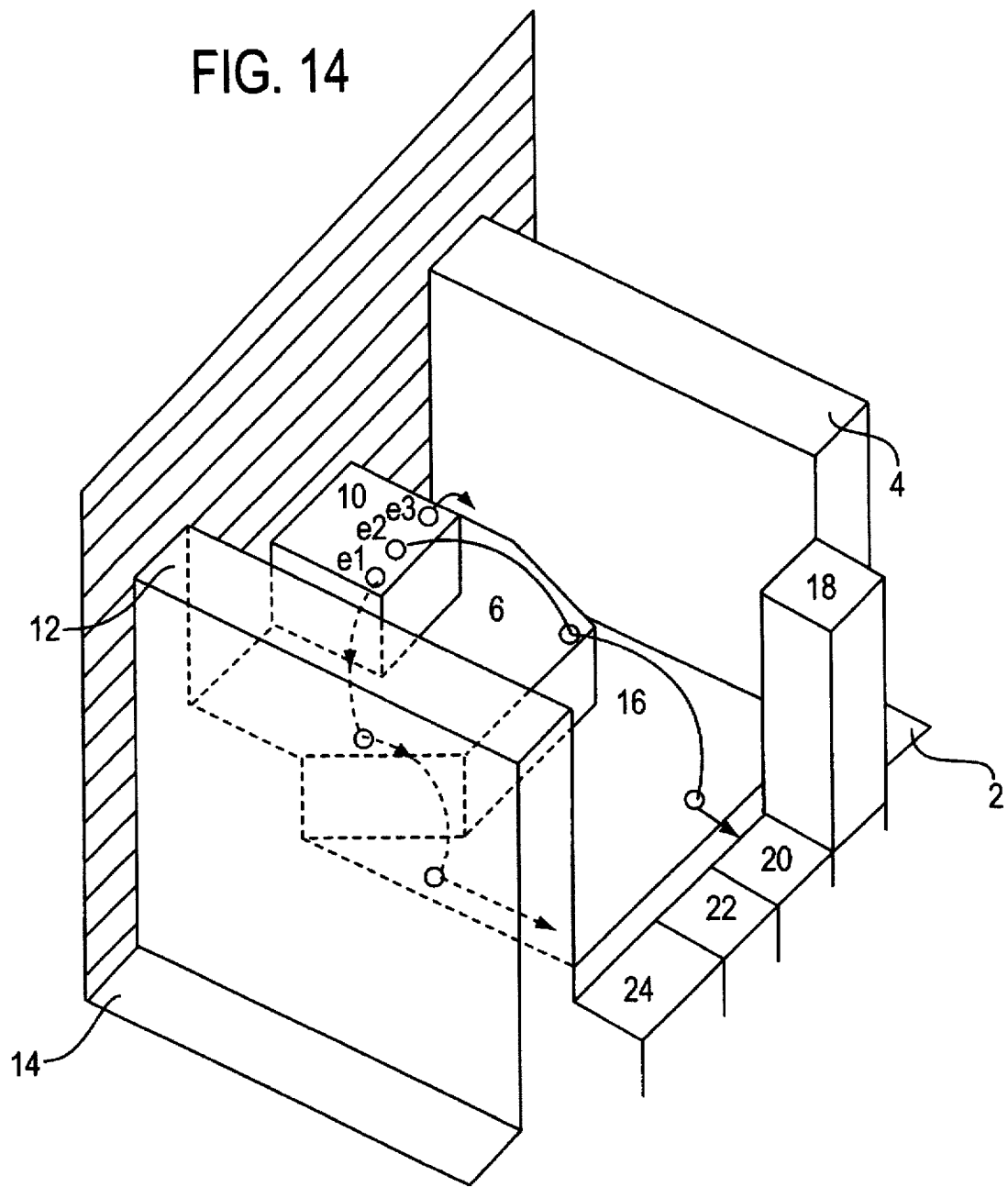

EFFICIENT CHARGE TRANSFER STRUCTURE IN LARGE PITCH CHARGE COUPLED DEVICE

BACKGROUND OF THE INVENTION

1. Field of the Invention

This invention relates to charge coupled devices (herein after CCDs), and in particular to photodetector pixels for interline transfer CCDs used for visible and near infrared imaging applications where a large pixel pitch and/or high-speed photosite-to-vertical CCD transfer time is required.

2. Description of Related Art

CCDs are limited in their speed of operation by the large time constants associated with thermal diffusion assisted charge transfers which typically helps move the last remaining potion of a charge packet. In order to achieve a high speed of operation it is desirable that a strong lateral electric field be present such that this lateral electric field and not thermal diffusion is the dominant mechanism for transfer of any remaining charge. The lateral electric field has a strong dependence on the length of the gates used in a CCD, since the electric field between two regions of varying potential is determined by the difference of potential divided by the distance between them. As a result, larger pitch CCDs are limited in transfer speeds since they rely almost entirely on the thermal diffusion drift components and have only weak fringing fields to assist the movement of charge.

Charge coupled devices have found applications in imaging where incident optical energy comprising photons is converted into a proportionally sized charge packet comprising electrons. The charge packet is read out in a serial manner to an output amplifier which converts each charge packet to a voltage which can further be processed to reconstruct the image.

For the purposes of this disclosure we consider buried channel NMOS CCDs which are fabricated in a lightly doped p-typed epitaxial layer on heavily doped p-type substrate; these details are intended to be illustrative of the apparatus and methods discussed rather than restrictive.

Underneath all CCD gate electrodes, an n-type implant has been made into the p-type substrate which results in an n-region (an NMOS buried-channel). For a given CCD gate structure, the maximum channel potential underneath the gate is a function of the substrate doping, the buried channel doping, and the bias on the gate. The maximum channel potential at zero volts gate and substrate bias is referred to, somewhat loosely, as the 'threshold voltage' in analogy to depletion MOSFETs. The buried channel doping can be decreased to create a lower potential for a given gate bias by additional p-type ion implants in the channel. The channel is still an n-type channel although of lesser electron concentration.

An important aspect of the operation of a CCD is the efficiency with which a charge packet can be transferred from one potential well to another.

There are three chief mechanisms for charge transfer in a CCD. The first is self induced drift which is produced by electrostatic repulsion of carriers. Most of the charge in the pixel is transferred by this mechanism. The next important transfer mechanism is due to the fringing fields (also referred to as drift or lateral electric fields in this document). These fringing fields are due to lateral electric fields that are present due to variations in channel potential which in turn result from varying gate biases and/or changes in the gate threshold voltage. They result in fast transfers if distances involved are short. These fringing fields are present even at low charge concentrations and are usually responsible for transferring the last bit of the signal charge. As a result, these fringing fields are critical to the charge transfer efficiency of a CCD. Finally, the third component is due to thermal diffusion which is caused by a gradient in carrier concentrations. Change transfer according to this component is the slowest of the three transfer mechanisms. It is also the dominant means of transferring the last portion of charge in longer gate length CCDs where fringing fields are either absent or weak due to the gate dimensions.

The three time constants associated with these mechanisms are:

$$\tau_D = L^2/2.5D,$$

$$\tau_{FF} = L/\mu_N E_{min}, \text{ and}$$

$$\tau_{SI} = L^2 C_{\text{eff}}/Q_o,$$

where L is the gate length, D is the electron thermal diffusion coefficient, $C_{\text{eff}}$ is the effective capacitance/area, $Q_o$ is the initial charge, and $\tau_D$, $\tau_{FF}$, $\tau_{SI}$ are the time constants associated with the diffusion, fringe field and self induced drift components, respectively, of the charge transfer mechanism.

Most of the charge is transferred by self induced drift. However, for the last portion of the packet when self induced drift is not strong, the charge transfer mechanism has to rely almost entirely on fringing fields and/or thermal diffusion. CCDs with large gate dimensions rely on thermal diffusion to move the remaining portions of the charge packet. In order that the transfer not be limited by diffusion (since the diffusion time constant is largest), it is desirable that shorter gate lengths be used such that the fringing fields are still significant over the length of the transfer. If the transfer time is known, the optimum gate length which is not limited by diffusion can be computed. Typically, this length is less than 10 μm. In gates with lengths longer than this 10 μm, transfer inefficiencies become significant.

A combination of strong self induced drift and fringing fields will result in a high drift velocity of the carriers thereby making possible a high speed transfer of charge from one gate to another within the CCD with a maximized charge transfer efficiency (CTE).

Interline transfer (ILT) CCDs have found applications in imaging and are well described in the background literature. In FIG. 12, ILT pixel 100 includes three main structures: photo-sensitive structure 102 such as a photodiode or photogate, which accrues photocharge; exposure control/antiblooming structure 104 that can act as an electronic shutter and also sets the maximum charge packet that the photo-collection means can accumulate; and vertical CCD shift register 108 which transfers the collected photocharge to a horizontal CCD shift register where it can be transferred to an output amplifier. In operation, accumulated charge in photosensitive structure 102 is transferred to either exposure control structure 104 by control of gate electrode 106 or shift register 108 by control of gate electrode 110. The terms vertical and horizontal as used above define two dimensions of a plane in which an image is formed but are otherwise arbitrary in direction.

For the purposes of this disclosure, ILT pixels that have a polysilicon gate as a photoelement (photogate) are considered, and a reverse biased gated diode is used as an exposure control structure. These details are intended to be illustrative of the apparatus and methods discussed rather than restrictive.

If an ILT CCD sensor is intended to sense a weak optical signal, it is necessary to have relatively large pixels (i.e., large photo-sensitive regions) in order to have a good responsivitiy (i.e., response of the sensor in Volts per micro-Joule of light energy, per square cm of detector area). If the incoming photon flux is low, the area of the pixel is made large such that the pixel can accrue a reasonable amount of photocharge in a reasonable integration time.

In order for a large pitch sensor to have a proper response, it is desirable that the pixel demonstrate high charge transfer efficiency (CTE) at high speed in terms of transferring unwanted photocharge into the exposure control drain or transferring integrated photocharge into the vertical CCD.

To accomplish this, it is desirable that the charge transfer not be limited by thermal diffusion and that strong fringing fields be available to charge everywhere within the photogate.. This is especially true if we are dealing with a small charge packet, or if we intend to transfer the last remaining fraction of a larger charge packet into the exposure control structure or the vertical CCD. Normally, for such applications, fringing fields are created by variations in oxide thickness, or electrode lengths. However, variations in oxide thickness are difficult to manufacture. It is possible to break up a large photogate with a long length into shorter gates and to bias them differently such that a potential gradient is created. However, this approach introduces complexity in the design and manufacture of the device since each gate requires an interconnect to provide it with an electrical clock signal (e.g., a metal bus connected to a gate electrode through a cut in the interlayer oxide). This additional complexity reduces yield as well as the fill factor of the pixel.

A second approach is to have a resistive gate electrode where one end of the gate electrode is held at a low voltage while the other end is held at a high voltage. Since polysilicon is resistive, a voltage gradient will exist from one end of the gate to another. As a result, a potential gradient will also exist under the resistive gate, the highest potential being at the end with the high voltage and the lowest potential being at the end with the low voltage. A drawback with this approach is that this consumes considerable power since we are dissipating electric power in a resistor. This power is dissipated as heat energy which increases the temperature of the device which results in higher dark current.

U.S. Pat. No. 4,910,569 to H. J. Erhardt describes an approach for a 2-phase CCD wherein each gate of the 2-phase CCD has a tiered or stepped potential profile achieved with different ion implants. This patent discloses a CCD shift register wherein each phase of the CCD register has a stepped potential extending in one dimension.

The approach of Erhardt is not suitable for photogates because Erhardt's approach is intended for a one-dimensional transfer in a predetermined direction (i.e., along the direction of charge transfer in the one-dimensional CCD). In the case of a photogate, it is desirable to be able to transfer charge at appropriate times from the photogate to both the exposure control structure and the vertical CCD shift register. The transfer required is two-dimensional in that the charge must be able to move in two lateral and transverse directions. The process of fabricating Erhardt's CCD also differs from the present invention since only two implants are made under the gate to create a 3-tier potential profile in the present invention as compared to two implants to create a 2-tier potential profile in the Erhardt CCD.

In this disclosure, the stated method and apparatus achieves the objective of improving the charge transfer efficiency in the case of diffusion limited charge transfers as in CCDs with single large gates by creating regions of high fringe fields in the direction of charge transfer. This effectively reduces the length of any uniform potential region under a gate such that charge transfer is not diffusion limited. Further, this invention also simultaneously directs charge into an exposure control drain which is in a direction transverse to the direction of the vertical shift register.

SUMMARY OF THE INVENTION

It is an object of the present invention to provide a fast and efficient charge transfer structure and method, particularly for use in large pitch charge coupled device arrays. It is a further object of the present invention to provide a fast and efficient charge transfer structure and method which propels charge in a desired transfer direction by mechanisms which are faster and more efficient than thermal diffusion. It is a further object of the present invention to provide a fast and efficient charge transfer structure and method which propels charge in a desired transfer direction by at least one of self-induced drift and fringing field drift mechanisms. It is a further object of the present invention to provide a fast and efficient charge transfer structure and mechanism having a channel structure with a two-dimensional potential gradient which propels charge in one of a plurality of directions.

These and other objects are achieved in a charge coupled device having a plurality of output structures and a channel structure defined in a channel region beneath a gate electrode and coupled to each of the plurality of output structures, the plurality of output structures including first and second output structures. The channel structure includes a plurality of area structures, each area structure being characterized by a uniform potential which is different from the potential characterizing each of the other area structures. The plurality of area structures are arranged within the channel region to define a first increasing stepped potential gradient from any point within the channel region to the first output structure and define a second increasing stepped potential gradient from any point within the channel region to the second output structure. A dimension of each area structure traversing the area structure in a first gradient direction is less than or equal to a first critical length, the first critical length being defined by a first desired transfer time for transferring charge to the first output structure. A dimension of each area structure traversing the area structure in a second gradient direction is less than or equal to a second critical length, the second critical length being defined by a second desired transfer time for transferring charge to the second output structure.

These and other objects are achieved in a method of forming a charge coupled device having a plurality of output structures and a channel structure defined in a channel region beneath a gate electrode and coupled to each of the plurality of output structures, the plurality of output structures including first and second output structures. The method includes steps forming the first output structure, forming the second output structure, and forming the channel structure with at least one dopant species distributed non-uniformly therein so that the channel structure is characterized by a two-dimensional potential gradient. The two-dimensional potential gradient defines a first increasing potential gradient from any point within the channel region to the first output structure and a second increasing potential gradient from any point within the channel region to the second output structure.

These and other objects are achieved in another embodiment in which the step of forming a channel structure includes a step of forming a plurality of area structures, each area structure being characterized by a uniform potential which is different from the potential characterizing each of the other area structures. Each of the plurality of area structures is arranged within the channel region to define the first increasing potential gradient as a first increasing stepped potential gradient and define the second increasing potential gradient as a second increasing stepped potential gradient.

These and other objects are achieved in another embodiment in which the first increasing stepped potential gradient defines a first gradient direction corresponding to a direction of increasing potential, and the second increasing stepped potential gradient defines a second gradient direction corresponding to a direction of increasing potential. The step of forming a plurality of area structures includes a step of forming each area structure so that (1) a dimension of each area structure traversing the area structure in the first gradient direction is less than or equal to a first critical length, the first critical length being defined by a first desired transfer time for transferring charge to the first output structure, and (2) a dimension of each area structure traversing the area structure in the second gradient direction is less than or equal to the second critical length, the second critical length being defined by a second desired transfer time for transferring charge to the second output structure.

BRIEF DESCRIPTION OF DRAWINGS

The invention will be described in detail in the following description of preferred embodiments with reference to the following figures wherein:

FIG. 14 is a three dimensional perspective view of a potential surface of the channel structure when the pixel is controlled according to FIGS. 8–10.

DETAILED DESCRIPTION OF PREFERRED EMBODIMENTS

The basic premise of the present method and apparatus is that a higher charge transfer efficiency in a photogate type Interline Transfer CCD pixel can be achieved if a gradually sloping potential profile is present underneath the photogate as compared to a non-varying potential underneath the photogate. By creating such potential profiles, fringing fields are created within the pixel. These fields, defined by $E=-\nabla\phi$, result in a quicker transfer of charge as compared to a region with non-varying potential in which the speed of charge transfer is limited by the large transfer time constants associated with thermal diffusion. The concept of fringing fields is further explained by the use of a simple example shown in FIGS. 1A–1C.

Figure 1A:
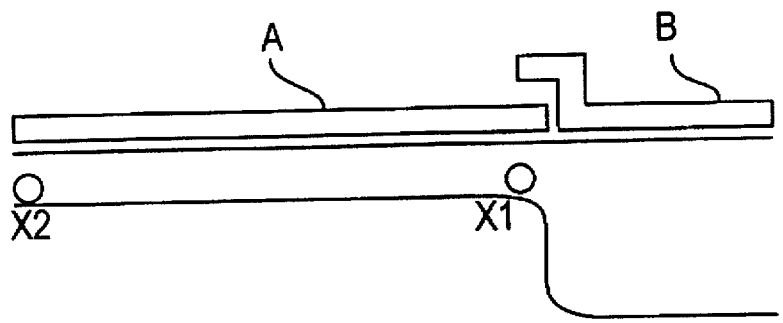
FIG. 1A is a cross-section of a prior-art interline transfer pixel showing the potential profile underneath the pixel during photogate-to-VCCD transfer; thereby illustrating the lack of fringing fields seen by the electric charge (×2) at the far end of the photogate.
Figure 1B:
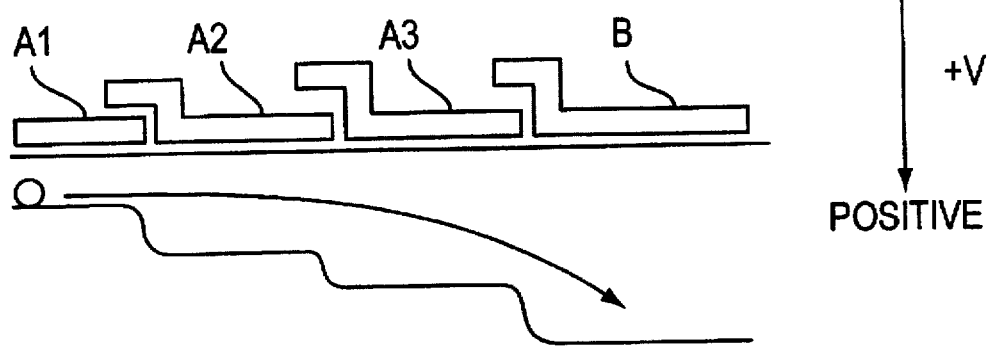
FIG. 1B is a cross-section of a pixel during photogate-to-VCCD transfer; where the photogate has been partitioned into several gates, each with a separate bias.

In FIG. 1A, charge needs to be transferred from gate A to gate B. Since the voltage bias on gate B is made higher than that on gate A, most of the charge moves by self induced drift and seeks the region with a higher potential (which is under gate B). However, once most of the transfer is complete and only a small fraction of electrons remain in gate A, lateral electric fields (i.e., fringing fields) will be the dominant transfer mechanism. For an electron at location X1, fringing fields will be strong such that it will be relatively quickly moved to gate B. However, for an electron at location X2, where fringing fields are not strong, the dominant transfer mechanism will be thermal diffusion which is relatively slow. In order to achieve an efficient transfer, it is desirable that a gradually sloping potential profile exist within gate A such that electric fields are available to influence charge everywhere in the pixel. One means of implementing additional fringing fields is to break up gate A, as shown in FIG. 1A, into shorter gates (i.e., A1, A2, and A3) as shown in FIG. 1B. In a typical NMOS CCD, fringing fields act over only limited distances. This distance is typically 10 μm for many CCD structures, but this distance will depend on semiconductor doping and gate insulator properties and thicknesses. Therefore, splitting a single gate into several gates and biasing each differently will create an electric field in the direction of gate B when the gate biases are such that $V_B > V_{A3} > V_{A2} > V_{A1}$.

Figure 1C:
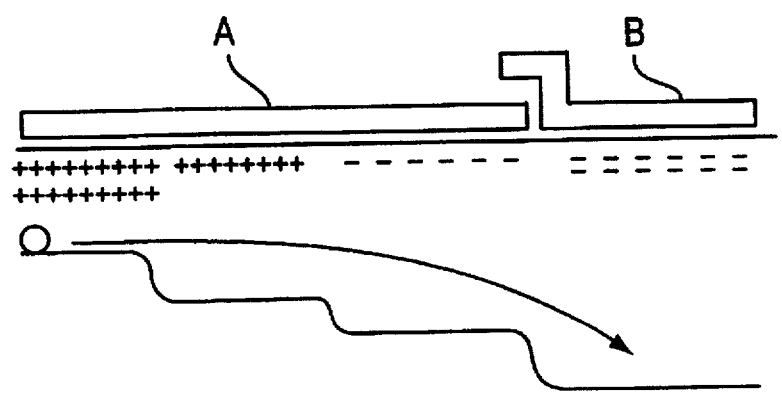
FIG. 1C is a cross-section of a pixel where the buried channel doping underneath the (singular) photogate is non-uniform.

Alternatively, such a potential profile as shown in FIG. 1B is provided in the present invention by means of impurity implants. These implants create regions of different channel potentials depending on the concentration of the dopant impurity in silicon. The end result is the same and is shown in FIG. 1C. Underneath the photogate, an n-type implant (e.g., phosphorous for illustrative purposes) has been made into the p-type substrate which results in an n-region throughout gates A and B (i.e., creating an NMOS buried channel). The left most portion of the region (as depicted in the figure) under gate A has a relatively larger p-type donor atom (e.g., boron) concentration which results in the channel potential being the smallest, the boron concentration tapers off under the gate towards the right side of the gate, the right most end of gate A being the most n-type region in the active imaging area. An n-type implant results in a higher channel potential whereas a p-type implant reduces the channel potential. It is possible to increase the "built-in" channel potentials in a desired direction of charge transfer by selectively implanting areas in the pixel with appropriate concentrations of dopant impurities. Through a proper selection of implants, an increasing channel potential in the direction of charge transfer is created.

Figure 2:
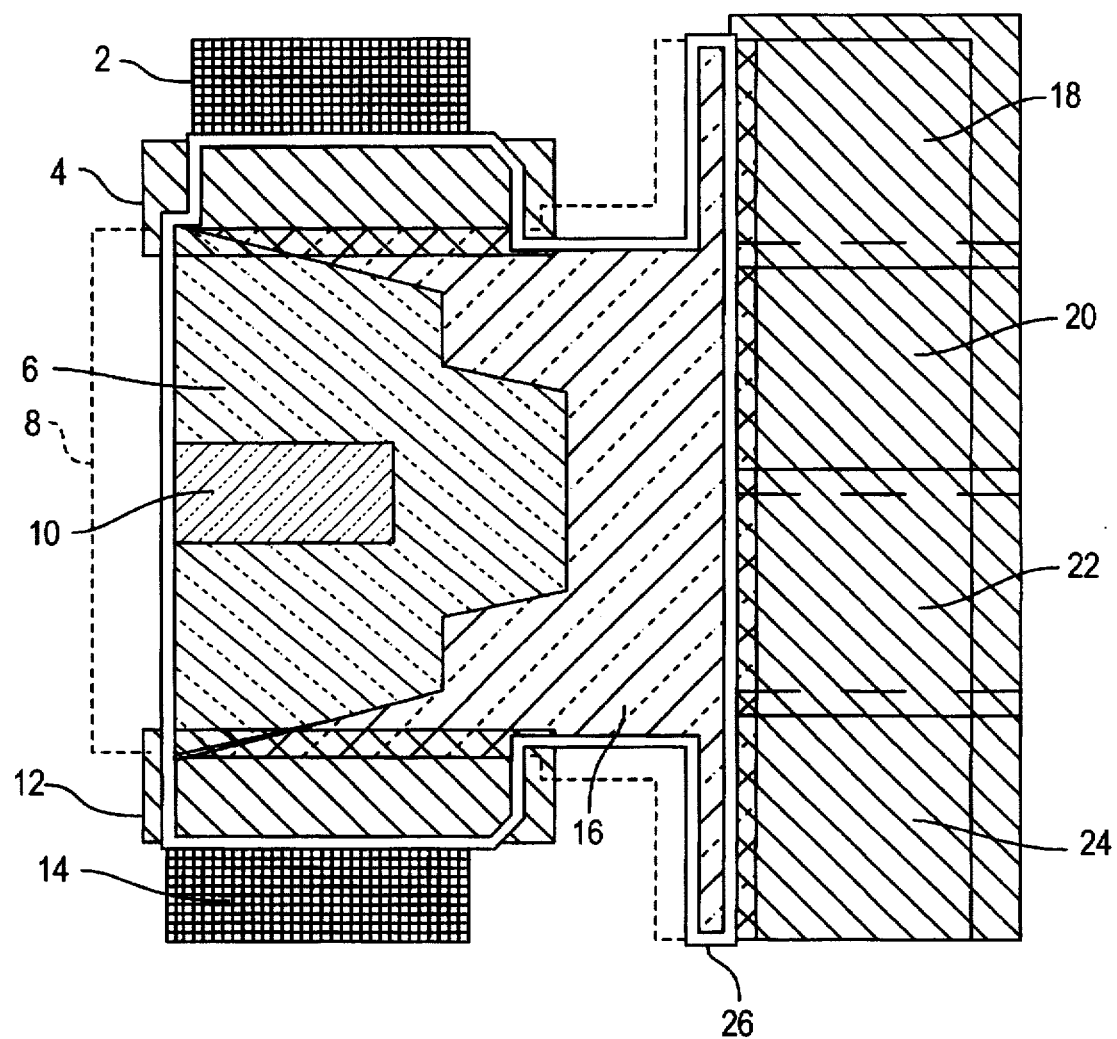
FIG. 2 is a top view of the pixel structure disclosed in this document.

In order to achieve an efficient charge transfer to a CCD output structure and to an exposure control structure, an interline transfer pixel according to the present invention is described. A top view of the pixel is shown in FIG. 2 and its operation and the different regions that comprise the pixel shown in FIG. 2 are described in the following text.

Areas 2 and 14 are reverse biased diodes comprising an n+ diffusion in a lightly doped p type substrate, held at a high potential. Areas 4 and 12 indicate exposure control gates operated to regulate charge transfer between the active imaging area defined by areas 6, 10 and 16 and the diodes defined by areas 2 and 14. These gates, depending on the bias applied, allow (during the exposure control mode) or prevent (during the integration mode) the charge to flow into the reverse biased diodes indicated by 2 and 14.

The region outlined by 8 indicates the extent of the gate electrode formed by a first polysilicon layer. Areas 6, 10 and 16 defined within the region 8 comprise a plurality of area structures arranged within the active imaging area.

Areas 6, 10 and 16 indicate regions where impurity implants are made in the pixel so as to create naturally existing potential gradient from region 10 which is the area of least potential to region 16 which has the highest channel potential. Region 10 in FIG. 2 corresponds to the left most region of gate A in FIG. 1C; region 16 in FIG. 2 corresponds to the right most region of gate A in FIG. 1C; and region 6 in FIG. 2 corresponds to the center region of gate A in FIG. 1C.

Areas 18, 20, 22, 24 comprise the vertical CCD shift register. After charge representative of an image has been integrated in the pixel containing areas 6, 10 and 16, the charge is transferred to the vertical CCD shift register. The active area in the pixel is channel region 26 shown bound by a thick line in FIG. 2 and subsequent figures. Areas 2 and 14 are reverse biased diodes hence not used for imaging, while the vertical CCD shift register which comprises areas 18, 20, 22 and 24 is covered by a light shielding metal layer so that it is not photoactive.

In order to efficiently and quickly transfer small charge packets from a large pixel, it is desirable to devise an architecture that enables a fast exposure control structure such that an electron at any position within channel region 26 can be quickly drained into the reverse biased diodes 2 and 14 (refer to FIG. 2). To facilitate this, two diodes are provided at the top and bottom of the pixels as opposed to a single diode used in conventional designs. Furthermore, the doping in channel region 26 underneath the photogate is non-uniform throughout the region in the present invention. Regions 6, 10 and 16 indicate regions of uniform but dissimilar channel doping. This doping distribution achieves a stepped potential gradient in channel region 26 of the pixel such that self-induced drift and fringing fields remain the dominant charge transfer mechanisms during exposure control. Additional boron implants can also be made under the exposure control gate (i.e., areas 4 and 12 in FIG. 2) as well as at the vertical CCD shift register edge adjoining the imaging region in the vertical CCD (to provide enhanced photogate-to-vertical CCD shift register transfer drift fields and also to contain charge in the vertical CCD when it is being read out.

Figure 3A:
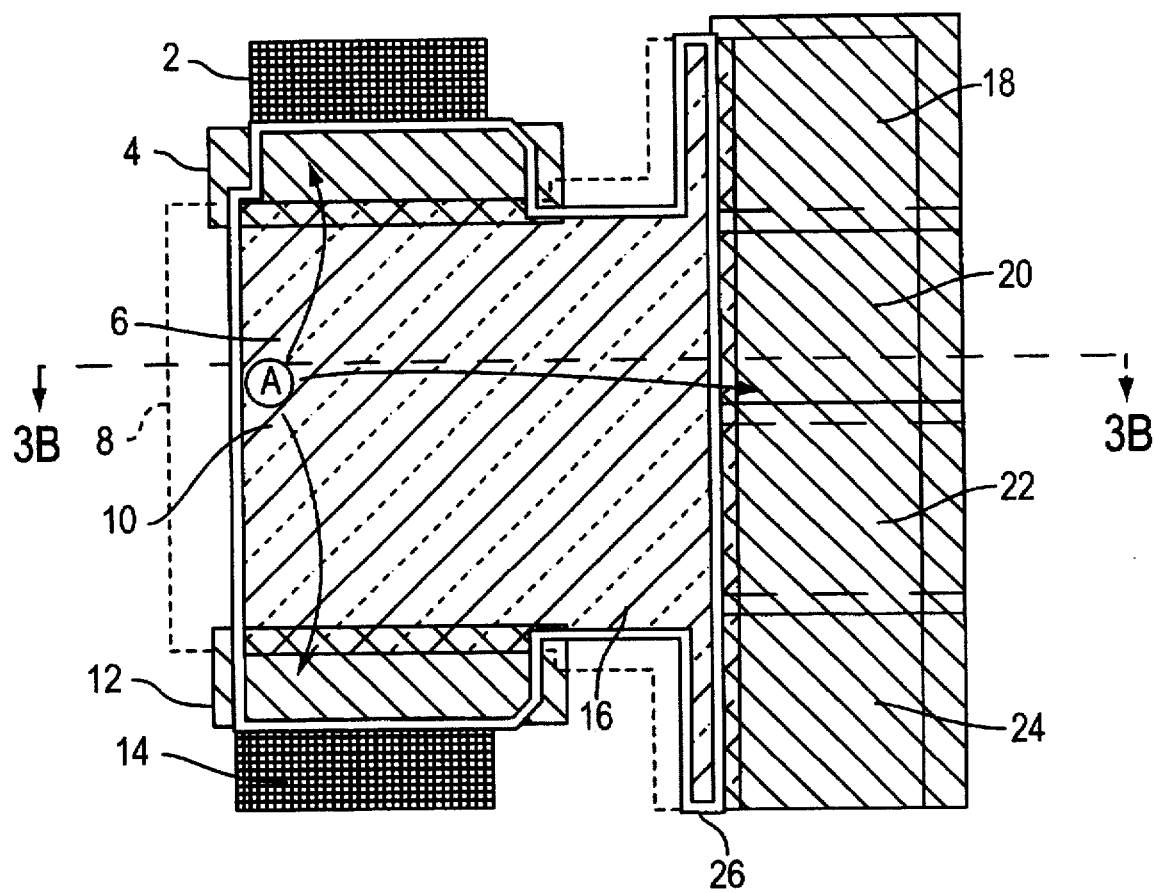
FIG. 3A is a top view of a pixel without a built-in potential gradient.
Figure 3B:
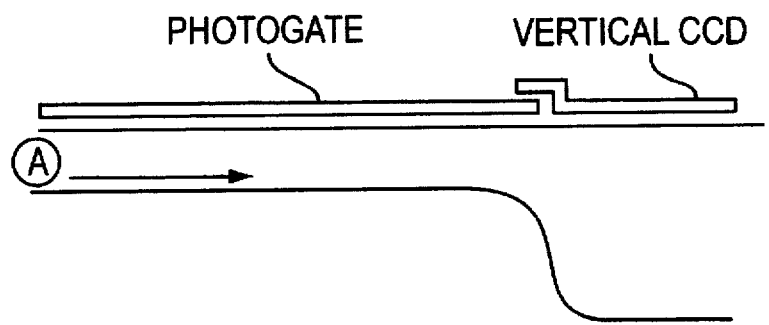
FIG. 3B is a section view of FIG. 3A showing potentials.

To explain the operation of FIG. 2, it is useful to first consider a similar pixel with uniform channel doping throughout channel region 26 underneath a photogate (FIG. 3A). A photo generated charge created at 'A' of FIG. 3A will have neither a strong self induced drift nor fringing fields to assist its movement to the diode drains 2, 14 or to the vertical CCD shift register. This is further illustrated in FIG. 3B where the cross section of the pixel along the axis 3B—3B' shows the channel potentials along the axis in the pixel. The situation depicted in FIGS. 3A and 3B where a high (1) bias is applied to the vertical CCD gate and a low (0) bias is applied to the photogate is similar to the situation depicted in FIG. 1A.

However, returning to FIG. 2, a phosphorous (buried channel) implant is made in the entire pixel except for the area marked by 10. A boron implant is made within the area bound by areas 6 and 10. The channel potential in area 10 is therefore equivalent to an enhancement surface region that has the lowest potential underneath the photogate. The n-type doping in area 6 becomes reduced (to be less n-type) by the boron implant. This ensures a channel potential greater than the potential in area 10 but less than that in area 16. As a result, steps in potential are created in an increasing potential gradient from areas 10 to 6 to 16. This idea can be further exploited by increasing the number of steps by the means of extra implants there by creating a more gradual potential gradient, or by implementing a continuously varying doping from area 10 to area 16. However, with the illustrated exemplary scheme the number of steps are adequate and fringing fields are available in the entire such that no region in the pixel is limited by the thermal diffusion mechanism of charge transfer. The gradient in the potential is accomplished by a minimum number of implants since the enhancement region is created by exclusion of the phosphorous implant. In effect, use is made of only two implants, one boron and one phosphorous, to create three potential steps in the pixel. This keeps processing complexities to a minimum. As a result of this structure, photogenerated charge does not stay in areas 6 or 10 since the charge seeks a region of maximum potential. The charge preferentially moves towards area 16 where it is held during integration. The enhancement region bound by area 10 typically has a lower charge transfer efficiency due to charge trapping by surface states; however, any performance degradation is avoided by filing these traps by introducing a fat zero (i.e., a small packet of charge introduced as the "zero" level which serves as a constant background charge in the CCD) either by electrical or optical means.

The pixel operates in one of an exposure control mode and an integration mode.

Exposure Control Mode

During the exposure control mode, the photogate (i.e., region 8 of FIG. 2) is biased low while the exposure control gates (i.e., regions 4 and 12) are biased high. As a result, no barrier exists between the channel structure beneath the photogate and the diode drains. Any charge generated within the imaging pixel is lost to the drains. Photocharge generated will preferentially flow towards areas 4 and 12 since the channel potential under these gates is higher than that in any region in the photogate including area 16. Due to the varying channel doping underneath photogate electrode 8, channel potential is lowest in area 10. Thus, electrons move out towards area 6 which has a higher channel potential. These electrons will be further pushed towards areas 4 and 12 where the potentials are yet higher and eventually into the reverse biased diodes 2 and 14.

Figure 4:
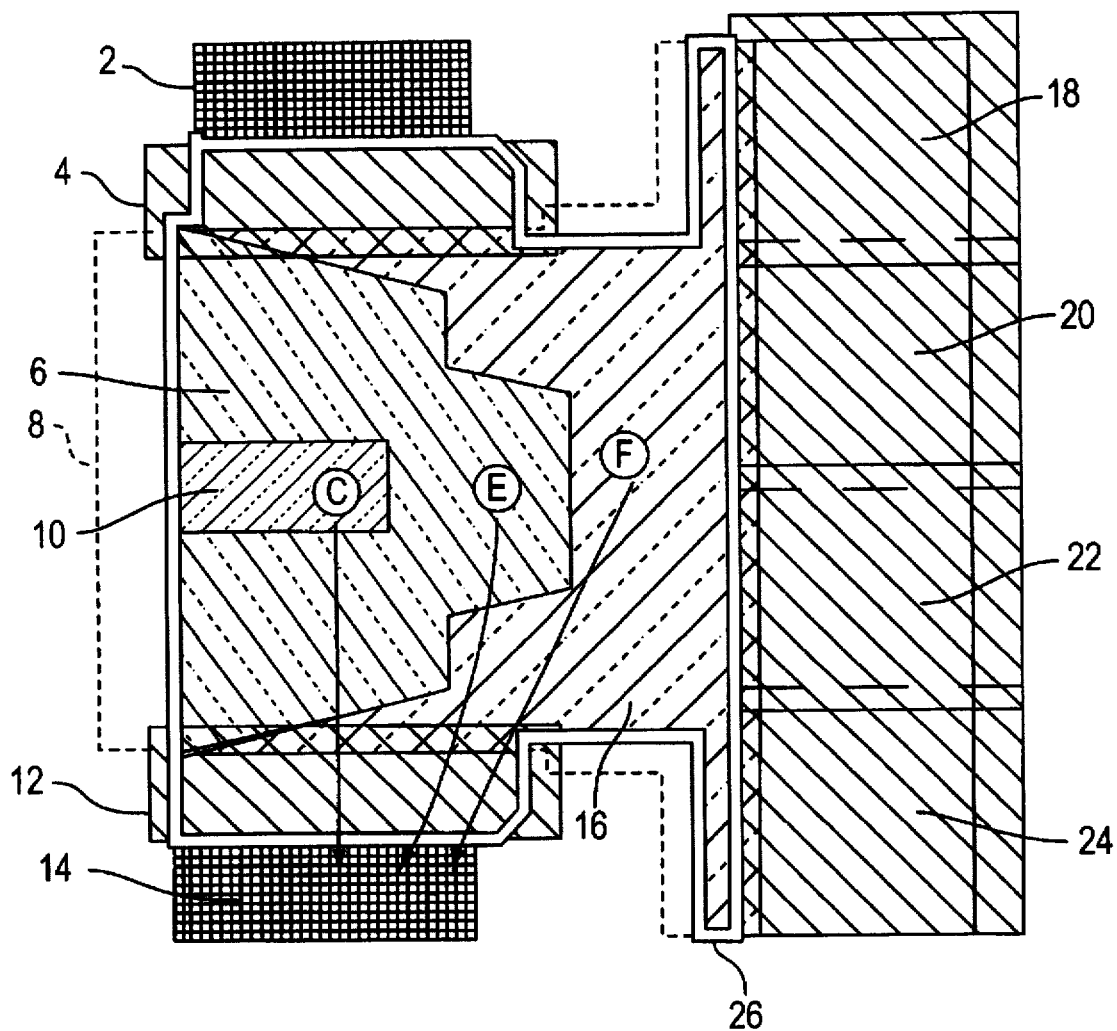
FIG. 4 is a top view of the pixel structure disclosed in this document where three charge transfer paths are shown into the lower exposure control drain.

Now consider a situation in which charge is generated in different locations within the pixel and track the movement of the charge, assessing the effect of the pixel implants to this movement. In FIG. 4, charge packets generated at different positions in the pixel move toward diode drains. The probable route that each charge packet (e.g., 'C', 'E' and 'F') would take to the diode drain is shown in FIG. 4. A cross section of the pixel and its potentials along the route an electron takes to travel to the diode drain from different positions in the pixel are shown in FIGS. 5, 6 and 7.

Figure 5:
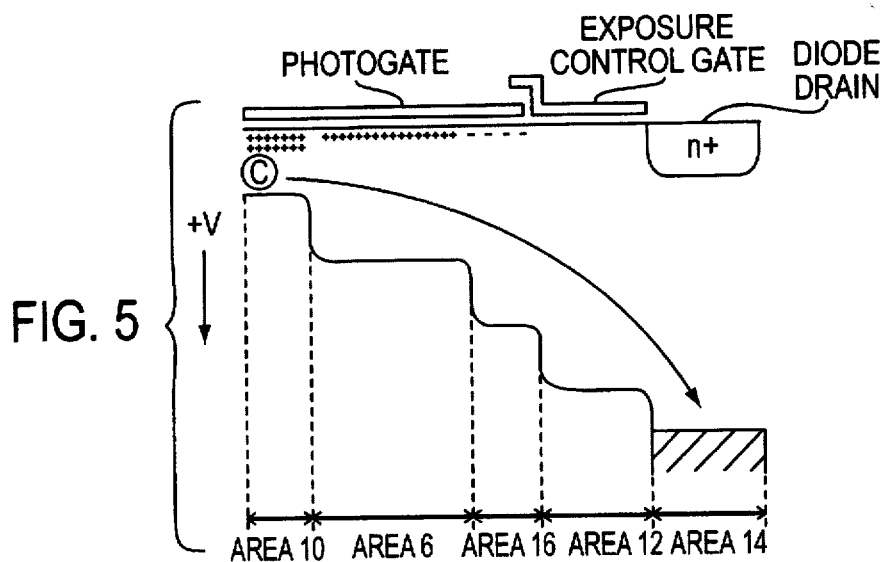
FIGS. 5, 6, and 7 are cross-sections of the structure in FIG. 4 where the potentials are shown during transfer of charge from the photogate into the lower exposure control drain.

FIG. 5 shows the path for a charge that is generated at the position denoted by 'C' in FIG. 4. During the exposure control mode, exposure control gate 12 is biased high while the vertical CCD gates (i.e., 18, 20, 22, 24) are biased to a low voltage. As a result, charge that is generated at 'C' tends to move towards the highest potential in the pixel (i.e., towards the exposure control gate 12). In FIG. 4, charge at 'C' is generated in the enhancement region, area 10, of the pixel. This region has the lowest channel potential in the structure. Adjacent to this enhancement region is area 6, where a phosphorous and a boron implant have been made. As a result of these implants, the channel potential in this area is higher than that in area 10. The highest potential in the imaging area exists in area 16. Only a phosphorous implant is made in area 16. Since the exposure control gate 12 is biased high, the potential in the channel beneath area 12 is higher than the potential anywhere in areas 6, 10 or 16. The result of this gradient in the channel potential is that a lateral electric field is created within the pixel which pushes an electron into the diode drain.

Figure 6:
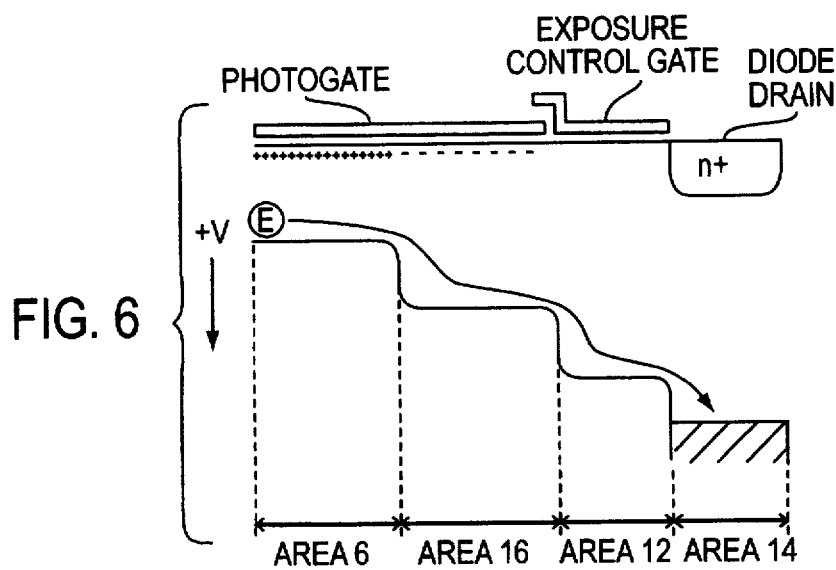
Figure 7:
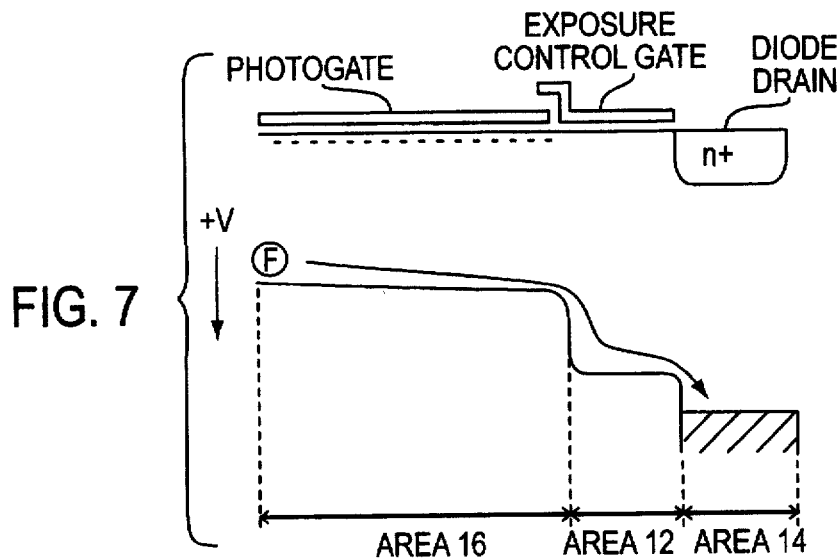

FIGS. 6 and 7 trace the paths of electrons created at the positions marked by 'E' and 'F' in FIG. 4. Fringing fields that assist an electron to move into the diode drain will not be as strong for the charge shown in FIG. 6 and will be the weakest for the charge shown in FIG. 7. However, by properly adjusting the dimensions of the gates and the areas of implants, we can minimize the length of the path associated with "F" and/or minimize the area of the region where charge transfer into the drain will be thermal diffusion transport limited. (Self-induced drift will also tend to assist the transfer of moderate-sized charge packets that may "pool" at the beginning of path "F" into the exposure control drain). The final result is that we minimize or eliminate a region within the pixel where charge transfer into the drains may be thermal diffusion transport limited. This is contrasted with the original pixel of FIG. 3A where nearly the entire pixel is thermal diffusion transport limited into the exposure control drains and the vertical CCD shift register.

Figure 13:
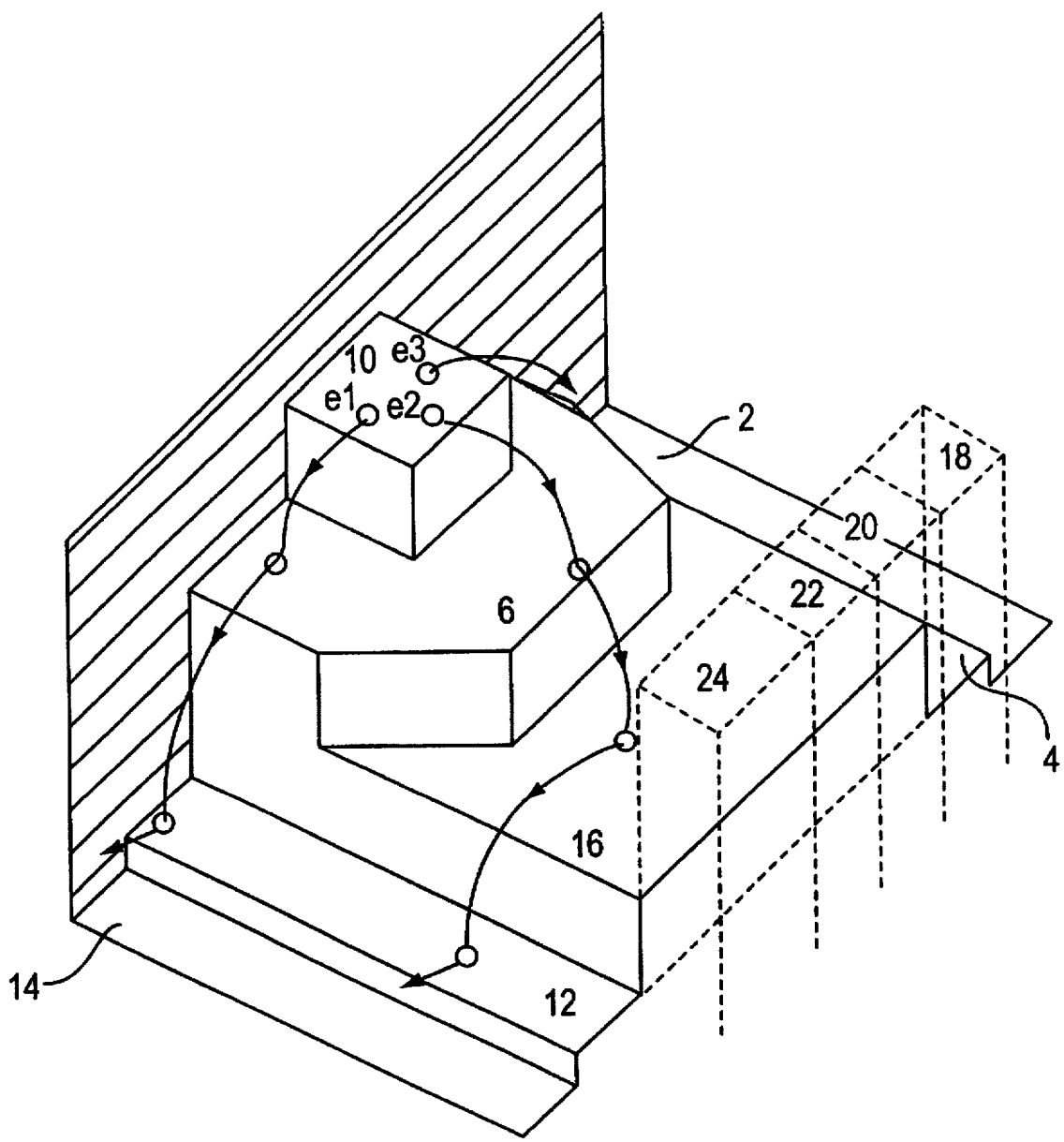
FIG. 13 is a three dimensional perspective view of a potential surface of the channel structure when the pixel is controlled according to FIGS. 4–7.

FIG. 13 shows a conceptual drawing of a photosite with increasing stepped potentials. Electrons e1, e2, e3 represent photocharge generated in area 10 under the photogate, their paths to the reset diodes are traced by the arrows as shown. A first increasing potential gradient propels charge from the photogate into either of the two reset diodes (2 or 14) which together comprise a first output structure (a second output structure being the vertical CCD shift register). The electrons follow the shortest possible path to the point of higher potential in the pixel (i.e. the reset diodes). As a result the location of the photogenerated charge in the pixel governs whether an electron generated is flushed into the upper or the lower reset diode.

Integration Mode

During the image integration mode, the photogate (i.e., area 8 in FIG. 2) is biased to a low potential, the exposure control gates (i.e., areas 4 and 12) are biased to an even lower potential. Thus, a barrier exists between the photogate and the reverse biased diode (i.e., areas 2 and 16) and none of the photo generated charge is allowed to flow into the diode drains. At most three of the vertical CCD gates (either 18, 20 and 22 or 20, 22 and 24) are biased to a high gate voltage. The gate voltages for the vertical CCD gates during transfer are much higher than the bias on the photogate. The channel potentials in the pixel are such that a minimum channel potential exists in area 10 and increases from regions 10 to 6 to 16. The maximum channel potential in the pixel is under the three vertical CCD gates that are biased to the most positive potential in the pixel. At least one vertical CCD is biased to a low voltage so that charge from different pixels along a column does not mix. It is also possible to integrate charge keeping the exposure control gates and all the vertical CCD gates biased low such that integrated charge is stored in region 16 before being transferred into the vertical gates.

Due to the implant profile in the pixel, no charge can be stored in areas 10 and 6 even though they are light sensitive. Any photo charge that is generated in these two regions moves into region 16 before being transferred to the vertical CCD for storage and readout.

Figure 8:
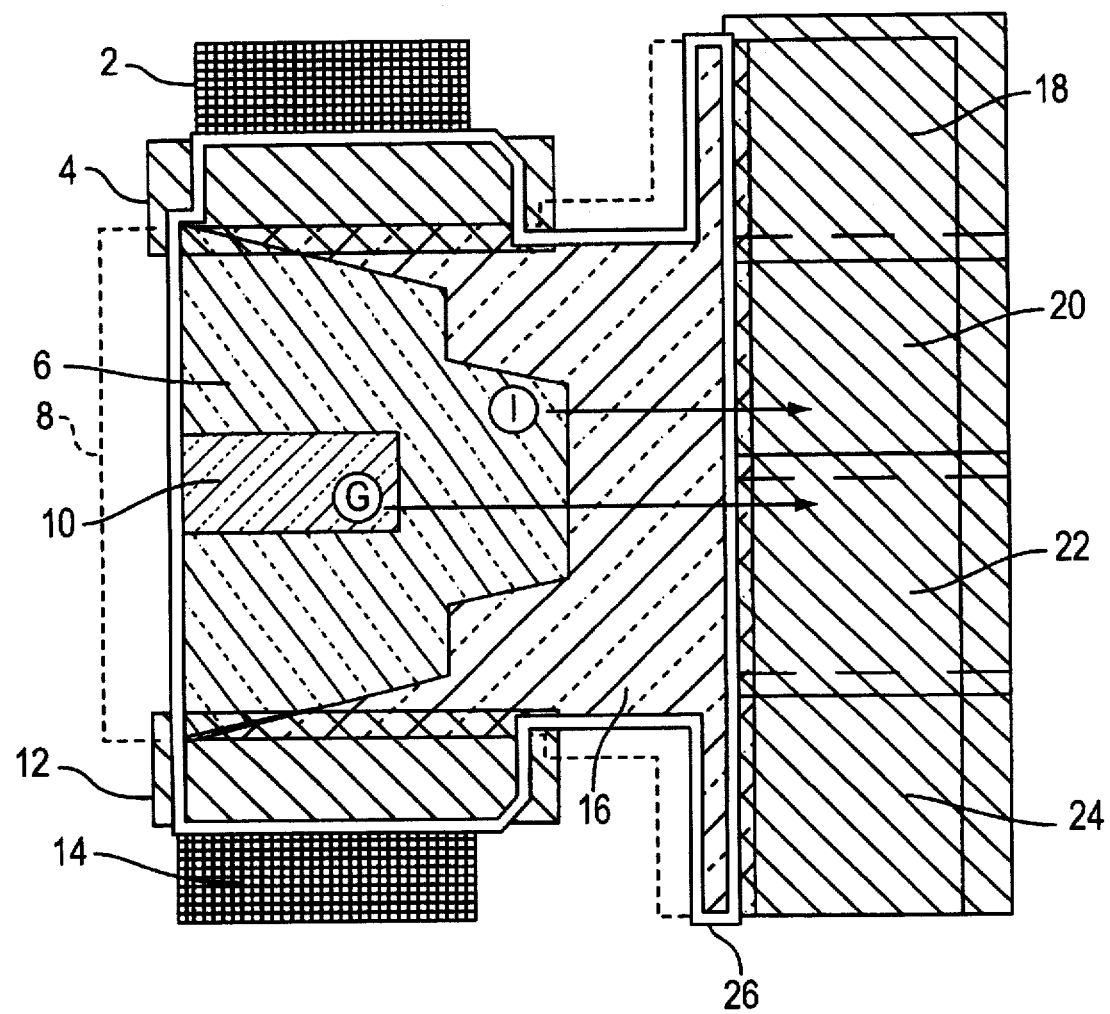
FIG. 8 is a top view of the pixel structure disclosed in this document where two charge transfer paths are shown into the vertical CCD.

FIG. 8 depicts a few locations where a charge can be generated in the pixel and the arrows indicate different possible paths to the vertical CCD.

Figure 9:
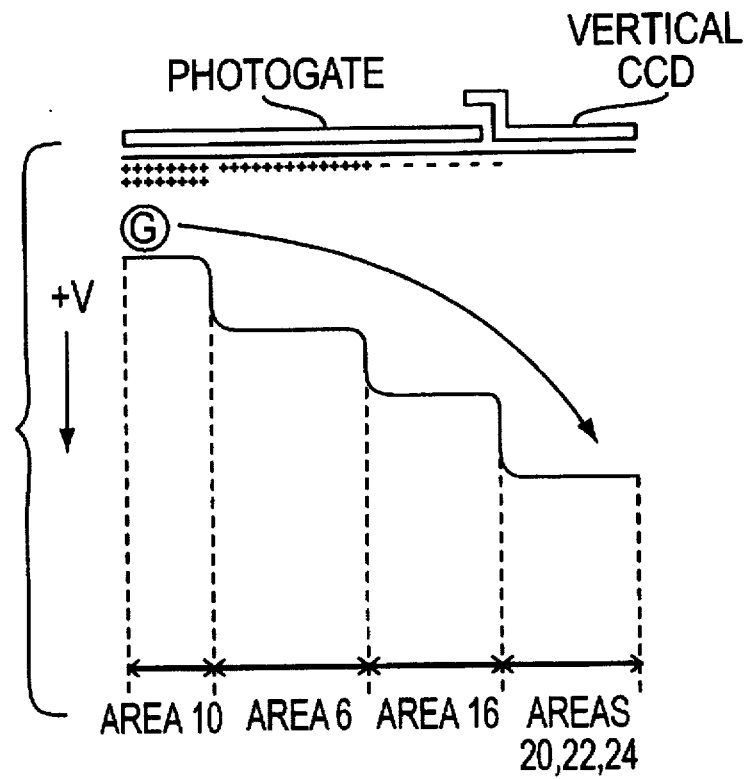
FIGS. 9 and 10 are cross-sections of the structure in FIG. 8 where the potentials are shown during transfer of charge from the photogate into the vertical CCD.

FIG. 9 traces the path of a photo charge generated at position 'G' in area 10, and shows the channel potentials in the pixel along this path. The photocharge is generated in area 10 which is the enhancement (surface channel) region. The channel potential here is the least, and a drift field exists in the direction of area 6 which has a higher channel potential. Area 16 which has only a phosphorous implant has the highest channel potential in the active imaging area. Since the vertical CCD shift register is biased to a high positive potential, the charge generated at 'G' moves from area 10 to 6 to 16 before being transferred into the vertical CCD shift register.

Figure 10:
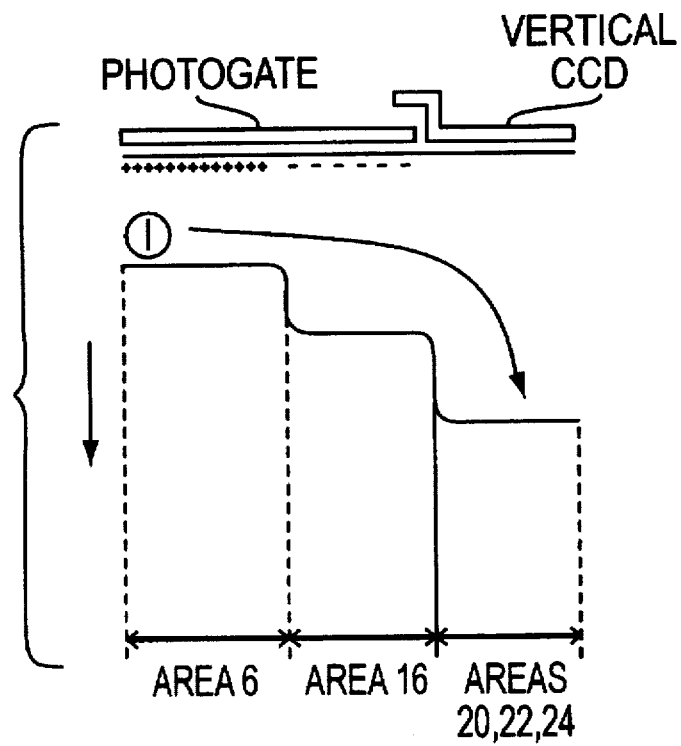

FIG. 10 traces the path of a photocharge generated at position 'I' which lies within area 6. The charge cannot move towards area 10 since area 10 has a lower channel potential. A potential gradient exists in the direction of increasing channel potentials and the charge can move only the direction from areas 6 to 16 to the vertical CCD shift register (i.e., 20, 22, 24).

FIG. 14 shows a conceptual drawing of a photosite with increasing stepped potentials. Electrons e1, e2, e3 represent photocharge generated in area 10 under the photogate, their possible paths to the vertical CCD shift register are traced by the arrows as shown. A second increasing potential gradient propels charge from the photogate into a second output structure which comprises the vertical CCD shift register (a first output structure being the reset diode). The second increasing potential gradient is defined as the direction of increasing stepped potential from any point in the pixel to the second output structure.

Having described preferred embodiments of an efficient charge transfer structure (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Figure 11:
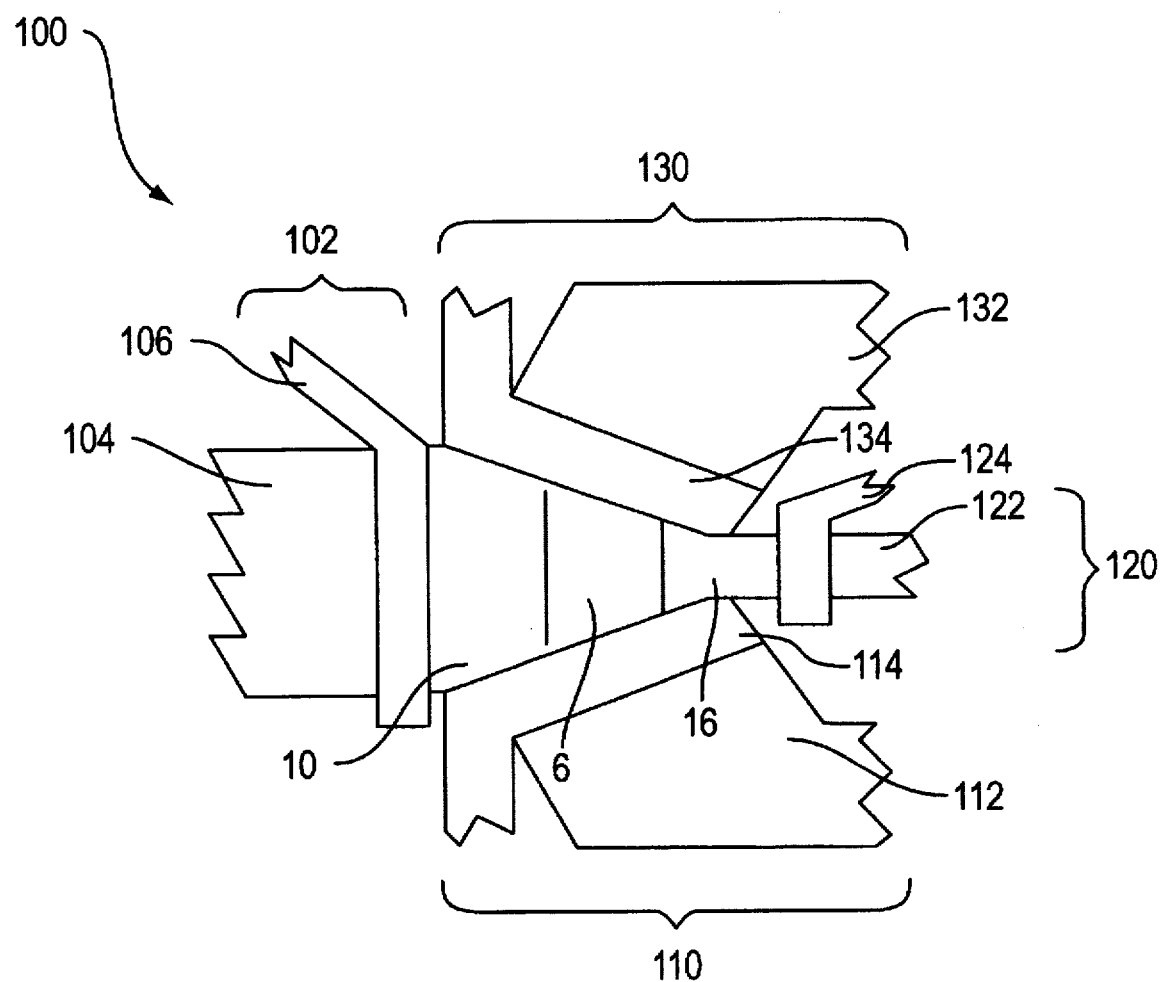
FIG. 11 is a top view of an alternative embodiment of the invention.
Figure 12:
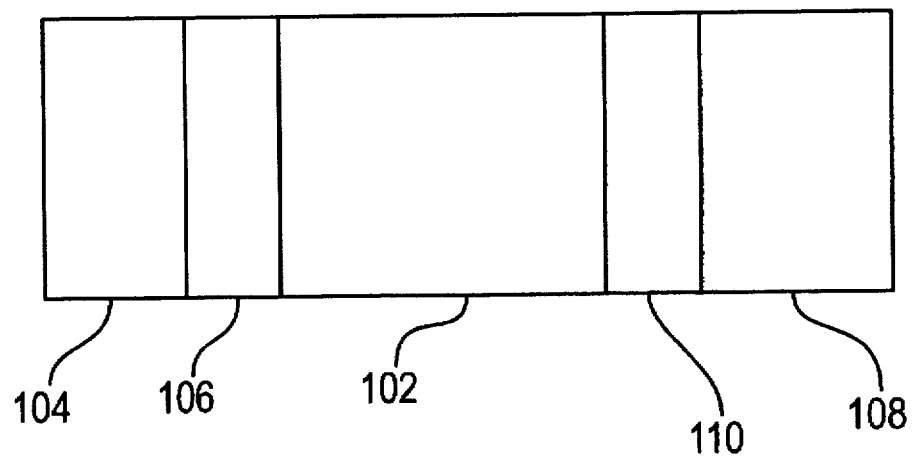
FIG. 12 is a functional block diagram of a pixel structure.

For example, the drains (see FIG. 2) are understood to constitute a first output structure (i.e., output in the sense that charge is transferred out of the photo-active region), and the vertical CCD shift register is understood to constitute a second output structure. It will be appreciated that additional output structures may be coupled to channel region 26 (FIG. 2) as well as one or more input structures. In FIG. 11, CCD structure 100 includes input structure 102, first output structure 110, second output structure 120 and third output structure 130. Input structure 102 includes input channel 104 and input transfer gate electrode 106 (e.g., formed from a layer of polysilicon). First output structure 110 includes first output channel 112 and first output transfer gate electrode 114 (e.g., formed from a layer of polysilicon). Second output structure 120 includes second output channel 122 and second output transfer gate electrode 124 (e.g., formed from a layer of polysilicon). Third output structure 130 includes third output channel 132 and third output transfer gate electrode 134 (e.g., formed from a layer of polysilicon). Centrally located in FIG. 11 are areas 6, 10 and 16 corresponding to comparable areas in FIG. 2. Collectively, areas 6, 10 and 16 constitute a channel structure (i.e., corresponding to channel region 26 in FIG. 2) comprising a plurality of area structures (e.g., areas 6, 10 and 16). Disposed over the channel structure is a gate electrode (not shown for clarity but corresponding to gate electrode 8 in FIG. 2). In operation, electrodes 114, 124 and 134 are biased low to form a barrier while electrode 106 is biased high and the gate electrode over the channel structure is biased intermediately to transfer charge from input channel 104 into area 10 of the channel structure. As discussed previously, charge in area 10 will move toward area 16 due to fringing fields. Then electrode 106 is biased low to form a barrier, and the gate electrode over the channel structure remains biased intermediately. One of electrodes 114, 124 and 134 is then biased high to facilitate charge transfer from the channel structure into a corresponding output channel. Each of the three output structures have associated therewith a desired transfer time for transferring charge. This desired transfer time, among other parameters, defines a corresponding critical channel length for each of areas 6, 10 and 16 which are not necessarily the same. The areas 6, 10 and 16 are arranged within channel region 26 so that a length traversing each area is less than the predetermined critical channel length along a charge transfer path which corresponds to the charge transfer to the respective output structure.

Having thus described the invention with the details and particularity required by the patent laws, what is claimed and desired protected by Letters Patent is set forth in the appended claims.

What is claimed is:

1. In a charge coupled device having a plurality of output structures, the plurality of output structures including first and second output structures, a channel structure defined in a channel region beneath a gate electrode and coupled to each of the plurality of output structures, the channel structure being formed with:

a first dopant species distributed non-uniformly therein; and a second dopant species distributed non-uniformly therein, wherein the channel structure is characterized by a two-dimensional potential gradient, the two-dimensional potential gradient defining a first increasing potential gradient from a point within the channel region to the first output structure and a second increasing potential gradient from the point within the channel region to the second output structure, wherein the channel structure comprises a plurality of area structures, each area structure being characterized by a uniform potential which is different from the potential characterizing each of the other area structures, wherein the plurality of area structures are arranged within the channel region to define the first increasing potential gradient as a first increasing stepped potential gradient and define the second increasing potential gradient as a second increasing stepped potential gradient, and wherein the plurality of area structures consists of first, second and third area structures, each area structure containing a unique combination of at least one of the first dopant species and the second dopant species.

2. The structure of claim 1, wherein:

the first area structure contains the first dopant species uniformly distributed therein;

the second area structure contains both the first and second dopant species uniformly distributed therein; and the third area structure contains the second dopant species uniformly distributed therein.

3. The structure of claim 1, wherein the channel structure and the gate electrode comprise a photo-sensitive structure.

4. In a charge coupled device having a plurality of output structures, the plurality of output structures including first, second and third output structures, a channel structure defined in a channel region beneath a gate electrode and coupled to each of the plurality of output structures, the channel structure comprising:

a plurality of area structures, each area structure being characterized by a uniform potential which is different from the potential characterizing each of the other area structures, the plurality of area structures being arranged within the channel region to define a first increasing stepped potential gradient in a first gradient direction from a point within the channel region to the first output structure and to define a second increasing stepped potential gradient in a second gradient direction from the point within the channel region to the second output structure and to define a third increasing stepped potential gradient in a third gradient direction from the point within the channel region to the third output structure, the first gradient direction being non-parallel to the second gradient direction, the third gradient direction being non-parallel to both the first and second gradient directions.

5. The structure of claim 4, wherein:

a length of each area structure traversing the area structure in the first gradient direction is less than or equal to a first critical length, the first critical length being defined so that at least one of self-induced drift and fringing field drift is the dominant charge transfer mechanism during a first desired transfer time for transferring charge to the first output structure;

a length of each area structure traversing the area structure in the second gradient direction is less than or equal to a second critical length, the second critical length being defined so that at least one of self-induced drift and fringing field drift is the dominant charge transfer mechanism during a second desired transfer time for transferring charge to the second output structure; and a length of each area structure traversing the area structure in the third gradient direction is less than or equal to a third critical length, the third critical length being defined so that at least one of self-induced drift and fringing field drift is the dominant charge transfer mechanism during a third desired transfer time for transferring charge to the third output structure.

6. The structure of claim 4, wherein the channel structure and the gate electrode comprise a photo-sensitive structure.

7. In a charge coupled device having a plurality of output structures, the plurality of output structures including first and second output structures, the first output structure including first and second reset diodes, a channel structure defined in a channel region beneath a gate electrode and coupled to each of the plurality of output structures, the channel structure being formed with a first dopant species distributed non-uniformly therein so that the channel structure is characterized by a two-dimensional potential gradient, the two-dimensional potential gradient defining a first increasing potential gradient in a first gradient direction from a point within the channel region to the first output structure and a second increasing potential gradient in a second gradient direction from the point within the channel region to the second output structure, the first gradient direction being non-parallel to the second gradient direction, the first increasing potential gradient defines a path in a direction of increasing potential from the point within the channel region to a nearest one of the first reset diode and the second reset diode.

8. The structure of claim 7, wherein:
   the second output structure comprises a vertical charge coupled device shift register; and
   the second increasing potential gradient defines a second path in a direction of increasing potential from the point within the channel region to the vertical charge coupled device shift register.

9. The structure of claim 7, wherein the channel structure and the gate electrode comprise a photo-sensitive structure.

* * * * *